US00RE44251E

(19) United States
(12) Reissued Patent
Asai et al.

(10) Patent Number: US RE44,251 E
(45) Date of Reissued Patent: Jun. 4, 2013

(54) CIRCUIT BOARD FOR MOUNTING ELECTRONIC PARTS

(75) Inventors: Motoo Asai, Gifu (JP); Yoichiro Kawamura, Gifu (JP); Yoji Mori, Gifu (JP)

(73) Assignee: Ibiden Co., Ltd., Ogaki-shi (JP)

(21) Appl. No.: 10/839,813

(22) Filed: May 6, 2004

Related U.S. Patent Documents

Reissue of:
(64) Patent No.: 6,384,344
Issued: May 7, 2002
Appl. No.: 09/412,877
Filed: Oct. 5, 1999

U.S. Applications:
(63) Continuation of application No. PCT/JP96/02608, filed on Sep. 12, 1996, and a continuation of application No. 09/068,481, filed on May 11, 1998, now abandoned.

(51) Int. Cl.
*H01R 12/04* (2006.01)
*H05K 1/11* (2006.01)

(52) U.S. Cl.
USPC ..... 174/261; 174/260; 174/262

(58) Field of Classification Search
USPC ..... 174/260–261, 262–266, 250, 267; 361/792–795, 760, 767–779
See application file for complete search history.

(56) References Cited

U.S. PATENT DOCUMENTS

| | | | | |
|---|---|---|---|---|
| 3,589,000 A | | 6/1971 | Galli | 29/590 |
| 3,716,761 A | | 2/1973 | Rotast | 317/100 B |
| 4,649,417 A | | 3/1987 | Burgess et al. | |
| 4,739,448 A | | 4/1988 | Rowe et al. | 361/386 |
| 5,286,926 A | | 2/1994 | Kimura et al. | |
| 5,300,402 A | | 4/1994 | Card, Jr. et al. | 430/280 |
| 5,336,370 A | | 8/1994 | Chipalkatti et al. | |
| 5,344,893 A | * | 9/1994 | Asai et al. | 525/398 |
| 5,447,996 A | | 9/1995 | Asai et al. | |
| 5,699,613 A | * | 12/1997 | Chong et al. | 29/852 |
| 6,124,408 A | * | 9/2000 | Wang et al. | 525/523 |

FOREIGN PATENT DOCUMENTS

| | | |
|---|---|---|
| EP | 0 186 831 | 7/1986 |
| EP | 0 327 399 | 8/1989 |
| EP | 0 539 075 A1 | 4/1993 |
| EP | 539075 | 4/1993 |

(Continued)

*Primary Examiner* — Jeremy Norris
(74) *Attorney, Agent, or Firm* — Oblon, Spivak, McClelland, Maier & Neustadt, L.L.P.

(57) ABSTRACT

A board for mounting electronic circuit parts includes a first connection terminal group including a plurality of connection terminals densely formed on the top surface of a substrate having through holes formed therein, and a second connection terminal group including a plurality of connection terminals formed at at least the peripheral portion of a back surface of the substrate. The first connection terminal group is connected to the second connection terminal group by way of the through holes. A build-up multilayer interconnection layer having via holes is formed on the top surface of the substrate, so that the first connection terminal group is connected to the second connection terminal group through the build-up multilayer interconnection layer and the through holes. According to another aspect, each signal line on the top surface of the build-up multilayer interconnection layer comprises a plurality of wiring patterns having different widths and a taper-shaped pattern that connects those wiring patterns together and whose width continuously changes. Each signal line has a smaller width at an area having a relatively high wiring density than at an area having a relatively low wiring density.

37 Claims, 7 Drawing Sheets

FOREIGN PATENT DOCUMENTS

| | | | |
|---|---|---|---|
| EP | 0592938 | A1 | 7/1993 |
| EP | 0 657 932 | A2 | 6/1995 |
| EP | 657932 | | 6/1995 |
| EP | 0 713 359 | A1 | 5/1996 |
| EP | 713359 | | 5/1996 |
| EP | 0 823 833 | A2 | 2/1998 |
| EP | 823833 | | 2/1998 |
| GB | 2 225 670 | A | 6/1990 |
| JP | 56-114361 | | 9/1981 |
| JP | 58-2054 | | 1/1983 |
| JP | 60-77452 | | 5/1985 |
| JP | 61-177762 | | 8/1986 |
| JP | 62-34469 | | 2/1987 |
| JP | 63-152159 | | 6/1988 |
| JP | 63-172490 | | 7/1988 |
| JP | 64-32662 | | 2/1989 |
| JP | 1-164086 | | 6/1989 |
| JP | 1-248589 | | 10/1989 |
| JP | 1-287934 | | 11/1989 |
| JP | 2-94460 | | 4/1990 |
| JP | 2-250392 | | 10/1990 |
| JP | 2-268456 | | 11/1990 |
| JP | 3-71649 | | 3/1991 |
| JP | 3-101193 | | 4/1991 |
| JP | 3-222348 | | 10/1991 |
| JP | 5-206591 | | 8/1993 |
| JP | 5-235199 | | 9/1993 |
| JP | 5-235546 | | 9/1993 |
| JP | 5-251511 | | 9/1993 |
| JP | 5-299837 | | 11/1993 |
| JP | 5-299846 | | 11/1993 |
| JP | 5-327224 | | 12/1993 |
| JP | 6-14215 | | 2/1994 |
| JP | 6-112355 | | 4/1994 |
| JP | 06061609 | A | 4/1994 |
| JP | 6-215623 | | 8/1994 |
| JP | 6-275959 | | 9/1994 |
| JP | 6-314752 | | 11/1994 |
| JP | 7-106767 | | 4/1995 |
| JP | 08172293 | A | 2/1996 |

* cited by examiner

CIRCUIT BOARD FOR MOUNTING ELECTRONIC PARTS

Matter enclosed in heavy brackets [ ] appears in the original patent but forms no part of this reissue specification; matter printed in italics indicates the additions made by reissue.

This appln is a cont of PCT/JP96/02608 filed Sep. 12, 1996 and a cont of Ser. No. 09/068,481 filed May 11, 1998 abn.

TECHNICAL FIELD

The present invention relates to a board that has connection terminals formed on both the top and back surfaces thereof and on which electronic circuit parts are to be mounted.

BACKGROUND ART

A wiring board 21 for mounting electronic circuit parts, as shown in FIG. 8, for example, is known as one conventional printed circuit board for mounting a bare chip like a flip chip or a package like a BGA (Bump Grid Array).

This type of wiring board 21 has a substrate 22 that has conductor layers formed on both the top and back surfaces by mainly a subtractive method. A parts mounting area is provided in the center of the top surface of the substrate 22. Formed densely in this area are multiple pads 23 which constitute a first pad group. The individual pads 23 correspond to bumps BP positioned on the bottom of a bare chip C1.

Multiple pads 24 which constitute a second pad group are formed on the peripheral portion of the back of the substrate 22. Formed on those pads 24 are bumps 25 as projecting electrodes for connection to a mother board. Multiple through holes 26 are formed through the substrate 22 at the peripheral portion of the substrate 22. Those through holes 26 are connected to the pads 23 on the top surface via a conductor pattern 27, which is formed on the top surface of the substrate 22. The through holes 26 are also connected to the pads 24 on the back surface via a conductor pattern 28, which is formed on the back surface of the substrate 22. Accordingly, the first group of pads 23 are electrically connected to the second group of pads 24 respectively on this wiring board 21.

According to the conventional wiring board 21, as shown in FIG. 8, wires temporarily led out to the peripheral portion on the top surface are led back toward the center on the back surface. The wires for connecting the pads 23 to the pads 24 therefore are longer than necessary, resulting in a poor wiring efficiency. The use of this wiring board 21 makes it difficult to increase the speed of signal transmission between electronic circuit parts to be mounted and the mother board.

To connect the pads 23 and 24 together by the shortest wires, the through holes 26 may be formed in the center portion of the board, not the peripheral portion thereof. In this case, however, dead space where wiring is not possible is formed in the portion where the through holes 26 are formed. Thus, to secure wiring space, the board itself would inevitably become larger.

With regard to another conventional wiring board 60 illustrated in FIG. 9, signal lines 62 connected to pads 61 have a given width irrespective of the positions of the signal lines. In this case, it is necessary to set the widths of the signal lines 62 smaller, so that the wiring resistance is likely to increase and line disconnection is apt to occur. This reduces the reliability of the wiring board 60.

There is a proposed solution to this shortcoming, in which each signal line 62 consists of a first wiring pattern 62b with a predetermined width and a second wiring pattern 62a having a width greater than that of the first wiring pattern 62b, as shown by two-dot chain lines in FIG. 9. In this case, the first wiring patterns 62b are arranged at a high wiring-density portion and the second wiring patterns 62a are arranged at a low wiring-density portion to facilitate the wiring and suppress the occurrence of line disconnection.

Since the first wiring pattern 62b is directly connected to the associated second wiring pattern 62a in this case, two sharp corners are formed at the connected portion. Stress is apt to concentrate on those corners, which raises another problem that cracks 64 are easily formed in a permanent resist 63 near the corners as shown in FIG. 10.

SUMMARY OF THE INVENTION

With a view to solving the above-mentioned problems, the present invention has been accomplished, and it is a primary objective of the present invention to improve the wiring efficiency while avoiding the enlargement of the entire board. Further, it is another objective of this invention to improve the wiring efficiency while suppressing an increase in the wiring resistance and the occurrence of line disconnection and preventing the occurrence of cracks in a permanent resist.

To achieve the above objectives, a board for mounting electronic circuit parts according to one aspect of this invention comprises:

- a first connection terminal group including a plurality of connection terminals densely formed over a top surface of a substrate having through holes formed therein;
- a second connection terminal group including a plurality of connection terminals formed at at least a peripheral portion of a back surface of the substrate, the first connection terminal group being connected to the second connection terminal group via the through holes;
- a build-up multilayer interconnection layer formed on the top surface of the substrate and including at least one conductor layer and at least one insulator layer alternately stacked one on another,
- the at least one insulator layer having a plurality of via holes for electric connection of the at least one conductor layer electrically connected to the through holes; and
- wherein the first connection terminal group is formed on an outermost layer of the build-up multilayer interconnection layer.

The first connection terminals are densely formed on the substrate and the second connection terminals are formed discretely. The first connection terminals are connected to the second connection terminals via the via holes as well as the through holes. It is therefore possible to shorten the wires without producing dead space and improve the wiring efficiency. This feature can provide a device which is equipped with electronic circuit parts and has an improved processing speed.

According to another aspect of this invention, there is provided a board for mounting electronic circuit parts, comprising a plurality of connection terminals and a plurality of signal lines formed on an insulator layer. The plurality of connection terminals are formed densely and are respectively connected to said signal lines.

Each of the signal lines include a plurality of wiring patterns with different widths and a taper-shaped pattern connecting said wiring patterns with the different widths so as to have a continuously changing width. Each of the signal lines has a smaller width at an area having a relatively high wiring density than at an area having a relatively low wiring density.

Since each signal line is so formed that it has a smaller width at an area having a relatively high wiring density than at an area having a relatively low wiring density, it is possible to form a wiring pattern having narrow line widths in the high wiring density area and having wide line widths in the low wiring density area. This suppresses the resistance and prevents line disconnection. It is also possible to secure the insulation between patterns in the high wiring density area.

Because wiring patterns with different widths can be connected by the taper-shaped pattern, insulation between signal lines can be secured without causing cracks in the permanent resist and the wiring resistance is not increased.

DETAILED DESCRIPTION OF THE INVENTION

Figure 1:
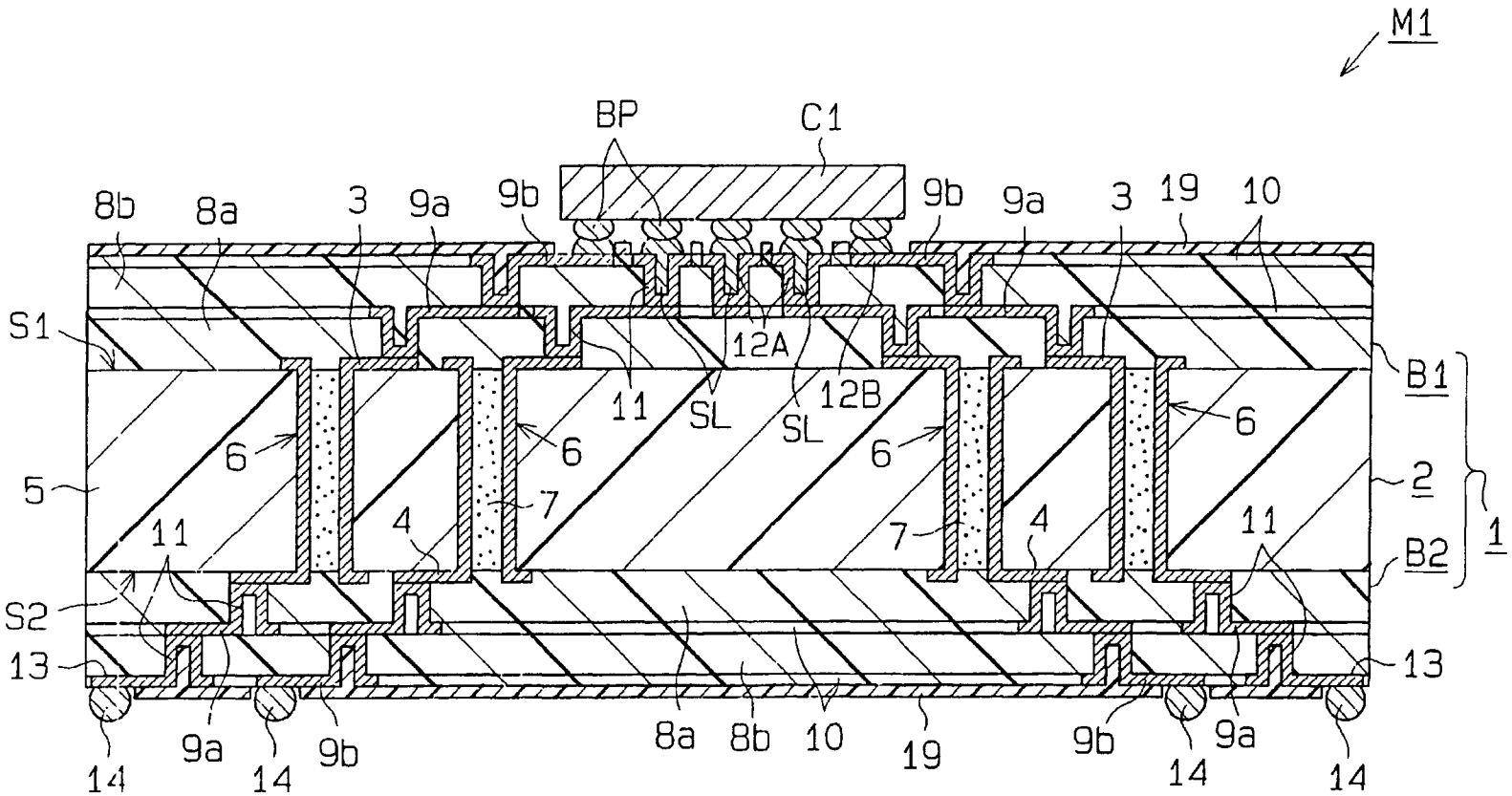
FIG. 1 is a schematic cross-sectional view of a wiring board according to the first embodiment of this invention.

The first embodiment of the present invention will be now described with reference to FIGS. 1 and 2. A wiring board 1 for mounting electronic circuit parts according to this embodiment has a substrate 2 whose top surface S1 and back surface S2 are both usable. The substrate 2 has conductor layers 3 and 4 formed on both the top surface S1 and back surface S2 of a base material 5 of resin by a subtractive method. A plurality of through holes 6 are formed in the substrate 2 to permit the conductor layers 3 and 4 to pass through the substrate 2 and over both the top and back surfaces of the substrate 2. Those through holes 6 are filled with a heat-resistant resin 7.

Formed on the top surface S1 and the back surface S2 of the substrate 2 are build-up multilayer interconnection layers B1 and B2 each having interlayer dielectric films 8a hand 8b and conductor layers 9a and 9b alternately stacked one on another.

On the build-up multilayer interconnection layer B1 on the top surface S1, a permanent resist 10 of a photosensitive resin is locally formed on the top of the first interlayer dielectric film 8a which is close to the top surface S1. The inner conductor layer 9a is formed in the portion where the permanent resist 10 is not formed. This inner conductor layer 9a is electrically connected to the inner conductor layer 3 on the top surface S1 of the substrate 2 by via holes 11 formed in the first interlayer dielectric film 8a.

Likewise, another permanent resist 10 is locally formed on the second interlayer dielectric film 8b provided on the first interlayer dielectric film 8a. The outer conductor layer 9b is formed where this permanent resist 10 is not formed. The outer conductor layer 9b is electrically connected to the inner conductor layer 9a by via holes 11 formed in the second interlayer dielectric film 8b.

The center portion of the top surface of the second interlayer dielectric film 8b, on the top surface (S1) side or the center portion of the first surface of the substrate 1, forms an area where an LSI bare chip C1 as electronic circuit parts is to be mounted. Multiple pads 12A and 12B, which constitute a first connection terminal group or a pad group, are formed densely in this area. Those pads 12A and 12B correspond to bumps BP formed at the bottom of the chip C1. The outermost pads in the first pad group are called "external pads 12B". The pads located in the center portion in the first pad group or the pads located inward of the external pads 12B are called "internal pads 12A".

Although this embodiment has only one outermost row of external pads 12B, the first to fifth rows of external pads starting from the outermost row can be used as external pads. In this case, the pads excluding those external pads are the internal pads 12A.

On the build-up multilayer interconnection layer B2 on the back surface S2, a permanent resist 10 is locally formed on the top of the first interlayer dielectric film 8a, which is close to the back surface S2. The inner conductor layer 9a is formed where the permanent resist 10 is not formed. This inner conductor layer 9a is electrically connected to the inner conductor layer 4 on the back surface S2 of the substrate 2 by via holes 11 formed in the first interlayer dielectric film 8a.

Likewise, another permanent resist 10 is locally formed on the second interlayer dielectric film 8b provided on the first interlayer dielectric film 8a on the back surface S2. The outer conductor layer 9b is formed where this permanent resist 10 is not formed. The outer conductor layer 9b is electrically connected to the inner conductor layer 9a by via holes 11 formed in the second interlayer dielectric film 8b on the back surface S2. Multiple pads 13, which constitute a second connection terminal group or a pad group, are arranged discretely on the outer peripheral portion of the second interlayer dielectric film 8b on the back surface side, or on the outer peripheral portion, of the second surface of the wiring board 1. Formed on those pads 13 are bumps 14 as projecting electrodes to make electric connection to an unillustrated mother board.

The external pads 12B in the first pad group are electrically connected to the associated via holes 11 by way of the outer conductor layer 9b, which extends toward the board's outer peripheral portion. The internal pads 12A are constituted of the via holes 11, which are made by forming metal films on the side walls and bottom walls of holes formed in the interlayer dielectric film 8b and connecting the conductor layers 9b and 9a by those metal films.

Solder SL is filled in each via hole 11 and protrudes from the hole 11 to constitute a so-called solder bump. The bumps of the solder SL are connected to the bare chip C1. With regard to the internal pads 12A, it is unnecessary to lead wires out toward the periphery of the board and is possible to shorten the wire lengths and increase the wire density.

The via holes 11 of the second interlayer dielectric film 8b are further electrically connected to the associated through holes 6 by the inner conductor layer 9a, the via holes 11 and the inner conductor layer 3. The inner conductor layer 4, which is connected to the through holes 6, is electrically connected to the pads 13 in the second pad group by way of the via holes 11, the inner conductor layer 9a and the outer conductor layer 9b. The inner conductor layers 3, 4 and 9a and the outer conductor layer 9b, which connect the first pad group to the second pad group, are laid out and extend in a direction from the center portion toward the board's outer peripheral portion, that is, in the radial direction.

Figure 2:
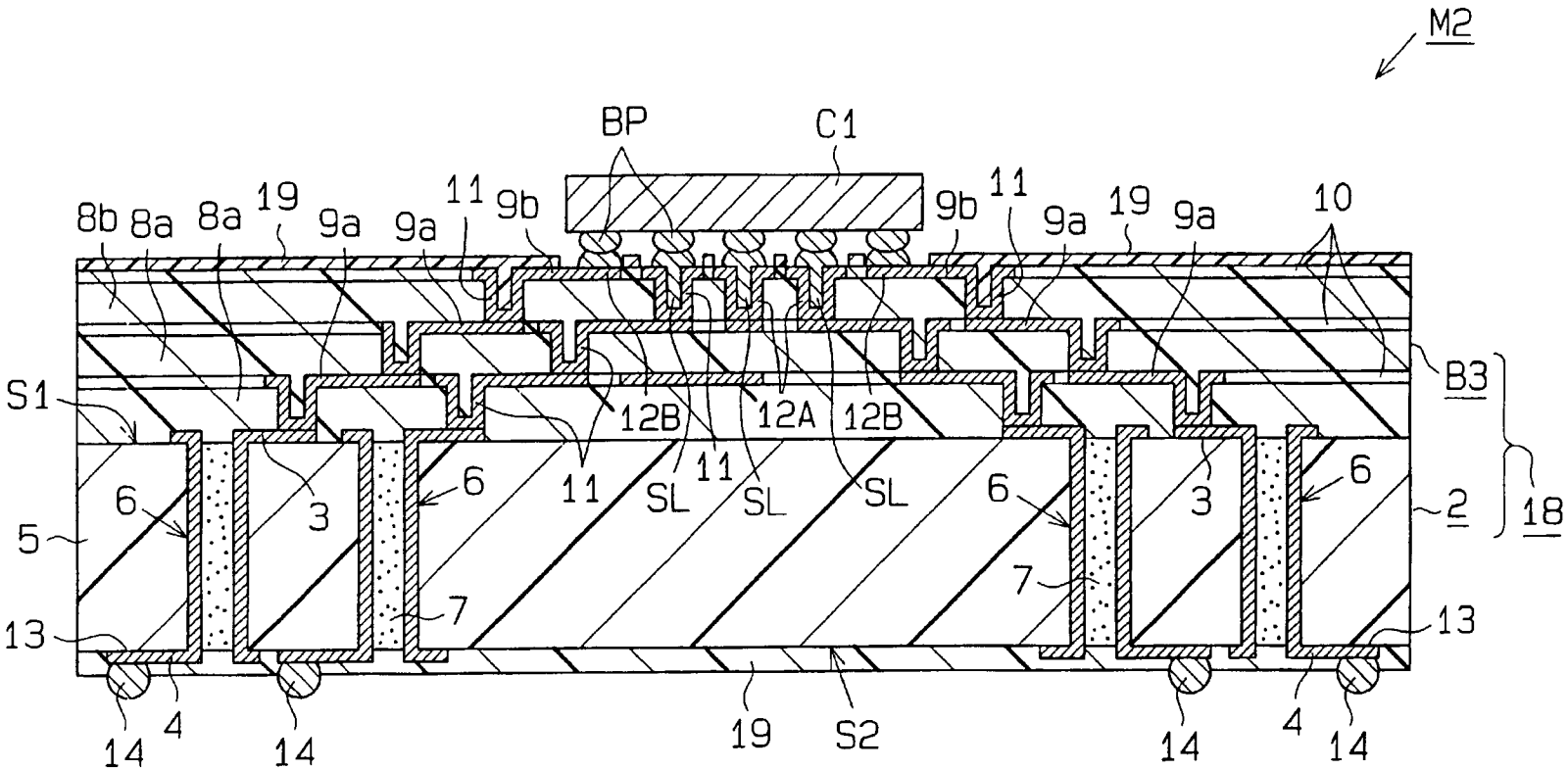
FIG. 2 is a schematic cross-sectional view of a wiring board according to a modification of the first embodiment.

As shown in FIGS. 1 and 2, solder resists 19 are formed on the surfaces of the build-up multilayer interconnection layers and on the connecting surface to the mother board. The solder resists 19 are provided to protect the conductor layers and prevent melted solder from flowing out to cause short-circuiting between patterns.

The interlayer dielectric films 8a, 8b constituting the respective build-up layers B1, B2 are preferably formed using a mixture of (a) a photosensitive resin which is hardly soluble in acids or oxidizing agents and (b) cured heat-resistant resin particles which are soluble in acids or oxidizing agents. The reason for this is that interlayer dielectric films containing such cured heat-resistant resin particles can facilitate developing treatment, and even if there are residues of developed portions on the substrate, such residual portions can be removed in a roughening treatment. Accordingly, even when the via holes 11 are of a high aspect ratio, such residual developed portions are hard to form. In the case where a photosensitive resin only is used, formation of via holes 11 having a diameter of about 80 μm or less becomes difficult.

The interlayer dielectric films 8a, 8b are preferably formed using a mixture obtained by adding (b) cured heat-resistant resin particles which are soluble in acids or oxidizing agents to a composite resin including (a1) a resin hardly soluble in acids or oxidizing agents, which is obtained by photosensitizing a heat-curing resin and (a2) a thermoplastic resin. The acids or oxidizing agents referred to herein mean chromic acid, chromates, permanganates, hydrochloric acid, phosphoric acid, formic acid sulfuric acid and hydrofluoric acid.

The resin (a1) hardly soluble in these acids or oxidizing agents, which is obtained by photosensitizing the heat-curing resin, is preferably at least one resin selected from epoxyacrylates and photosensitive polyimides (photosensitive PI). The reason is that these resins have high heat resistance and high strength.

The thermoplastic resin (a2) is preferably at least one resin selected from polyethersulfones (PES), polysulfones (PSF), phenoxy resins and polyethylenes (PE). The reason is that high glass transition temperature Tg and high modulus of elasticity can be imparted to the interlayer dielectric films 8a, 8b without impairing the properties of the heat-curing resin (a1).

The granular heat-resistant resin (b) is preferably at least one selected from amino resin particles and epoxy resin particles (EP resins). The reason is that the particles of such resins do not deteriorate the properties of the interlayer dielectric films. Incidentally, an epoxy resin cured by an amine type curing agent has a hydroxyether structure, and grains of such resin have a property of being dissolved, easily in the resin (a1) or (a2), advantageously. The amino resin can be selected, for example, from melamine resins, urea resins and guanamine resins. Selection of a melamine resin is preferred among others not only for its electrical properties but also because properties to be determined by PCT (pressure cooker test) and HHBT (high humidity bias test) can be improved.

The heat-resistant particles (b) preferably has a size of 10 μm or less. This is because the thickness of the interlayer dielectric films can be reduced, and fine patterns can be formed. The heat-resistant resin particles can be selected from various shapes such as spheres, splinters and aggregates.

The thus constituted wiring board 1 can be produced, for example, according to the following procedures. First, an adhesive to be employed for forming the interlayer dielectric films 8a, 8b by means of the additive method can be prepared as follows. This adhesive contains a component which is hardly soluble in acids or oxidizing agents and a component which is soluble in them.

1. A photosensitized oligomer prepared by acrylating 25% of epoxy groups in a cresol novolak type epoxy resin (CNA 25; molecular weight: 4,000), a PES (molecular weight: 17,000), an imidazole curing agent (2B4MZ-CN, trade name, manufactured by Shikoku Chemicals Corporation), trimethyl triacrylate (TMPTA) as a photosensitive monomer and a photo initiator (I-907, trade name, manufactured by Ciba Geigy) are mixed at a predetermined ratio with N-methylpyrrolidone. The mixing ratio of the components is as follows:

| | |
|---|---|
| Oligomer | 70 parts by weight |
| PES | 30 parts by weight |
| Imidazole | 4 parts by weight |
| TMPTA | 10 parts by weight |
| Photo initiator | 5 parts by weight |
| N-methylpyrrolidone | 80 parts by weight |

2. Further, 20 parts by weight of a powdery epoxy resin (TOREPAL EP-B, trade name, manufactured by Toray Industries, Inc.) having an average grain size of 5.5 μm and 10 parts by weight of the same powdery epoxy resin having an average grain size of 0.5 μm are admixed to the mixture.

3. The viscosity of the resulting mixture is then adjusted to 120 cps using a homodisperser, followed by kneading over a triple roll mill to obtain an adhesive.

4. Next, both surfaces of a substrate 2 having conductor layers 3, 4, through holes 6 and a heat-resistant resin 7 are entirely coated with this adhesive, followed successively by vacuum drying at 25° C. or air drying at 80° C., formation of openings for via holes by ultraviolet curing and developing treatments, and heat curing. Thus, a first interlayer dielectric film 8a is formed on each surface.

5. Subsequently, the surface of each first interlayer dielectric film 8a is treated with a roughening agent such as chromic acid to form a rough surface having a multiplicity of anchoring pits.

6. Then, application of catalyst nuclei, formation of permanent resist 10, activating treatment and electroless copper plating are carried out by the conventional procedures to form inner conductor layers 9a and via holes 11. The via holes 11 are formed by covering the wall surface and the bottom of each hole defined in the layer insulating material with a plating film so as to electrically connect the lower and upper conductor layers 9a and 9b. The wall surface of each hole is roughened (not shown) so that the plating will adhere intimately therewith and can hardly separate therefrom.

7. Further, the same adhesive is applied to the thus treated first interlayer dielectric film 8a and then cured to form a second interlayer dielectric film 8b on each side.

8. The surface of the resulting second interlayer dielectric film 8b is then treated with a roughening agent to form a rough surface. Subsequently, application of catalyst nuclei, formation of permanent resist 10, activating treatment and electroless copper plating are carried out to form outer conductor layers 9b, pads 12A, 12B and 13 and via holes 11 at predetermined positions. A photosensitive resin is applied on each surface of the thus treated board, and the resulting board is subjected to light exposure and developing treatments to form a solder resist 19, with the pads 12A, 12B and 13 being exposed.

9. A solder layer SL is formed on these pads 12A, 12B and 13. First, a nickel-gold plating (not shown) is applied to the pads 12A, 12B and 13, and then a solder paste is printed thereon by means of the printing method and is subjected to fusing to form solder bumps, or a film having a solder pattern formed thereon is superposed onto the pads 12A, 12B and 13 to transfer the solder pattern thereto with heating and form solder layers (solder bumps).

The desired wiring board 1 is completed by going through the procedures described above. If a bare chip C1 is mounted on the thus formed wiring board 1, an electronic-circuit-parts mounted device M1 as shown in FIG. 1 can be obtained.

According to the wiring board 1 of this embodiment, none of the internal pads 12A located in the center portion in the first pad group are connected to the outer conductor layer 9b, but the via holes 11 serve as the internal pads 12A to be electrically connected directly to the inner conductor layer 9a. That is, the individual internal pads 12A are electrically connected to the inner conductor layer 9a via the associated via holes 11.

It is therefore unnecessary to lead out the outer conductor layer 9a toward the board's outer peripheral portion on the second interlayer dielectric film 8b where the first pad group is formed. Even if the external pads 12B are located outward of the internal pads 12A, therefore, they do not interfere with the interconnection. Because there is no outer conductor layer 9b to be led out from the internal pads 12A, it is possible to densely lay out the outer conductor layer 9b that is led out from the external pads 12B. In other words, the overall wiring density can be increased as compared with the conventional structure.

Further, in this embodiment, an adhesive, which is of a mixture of a photosensitive resin hardly soluble in acids or oxidizing agents and heat-resistant resin particles soluble in acids or oxidizing agents, is employed when forming the interlayer dielectric films 8a, 8b constituting the build-up multilayer interconnection layers B1, B2. Therefore, when the interlayer dielectric films 8a, 8b are subjected to ultraviolet exposure so as to form via holes, residues of developed portions scarcely remain at the positions where the via holes are formed.

Although the reason for it is not clarified, it is surmised that in the case where the heat-resistant resin particles are present, the total amount of resin to be dissolved is smaller than in the case where the photosensitive resin only is to be dissolved, and even if residues of developed portions are present, the heat-resistant resin particles-and the photosensitive resin are dissolved together when the heat-resistant resin particles are to be dissolved by the roughening treatment.

It is thus possible to easily and surely form via holes 11 smaller than the conventional via holes. Of course, the conductor layers 9a and 9b formed by an additive method become finer than the conventional conductor layers formed by the subtractive method. Thus, the wiring density can be improved as compared with the conventional structure.

Figure 8:
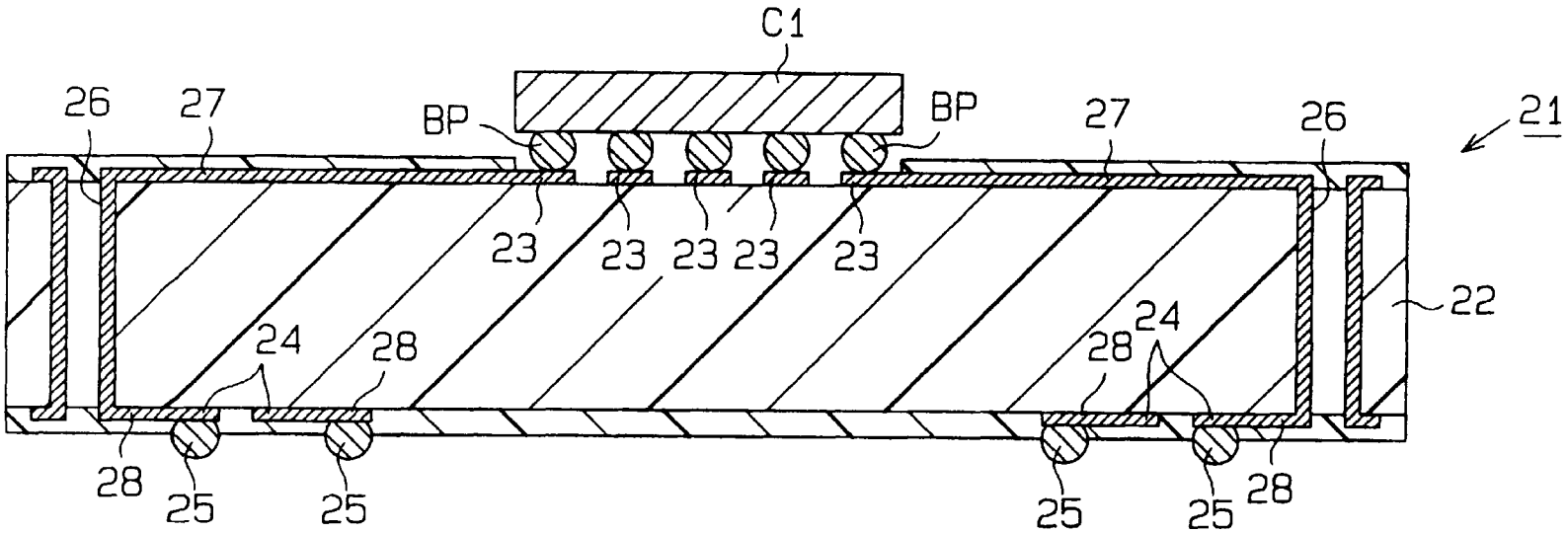
Fig.8 (Prior Art)
FIG. 8 is a schematic cross-sectional view of a conventional wiring board.

According to this embodiment, the inner conductor layers 3, 4 and 9a and the outer conductor layer 9b, which connect the first pad group 12 to the second pad group 13, are connected by the via holes 11 and are laid out in the radial direction (from the center portion toward the board's outer peripheral portion). This structure differs from the conventional structure shown in FIG. 8 in which wires led out to the outer peripheral portion are led back toward the center portion. The wires connecting the pads 12 to the pads 13 become shorter by the elimination of such conventional led-back wires, thus positively improving the wiring efficiency. It is therefore possible to accomplish a faster processing speed.

The wiring board 1 of this embodiment is also characterized in that wires are formed on the conductor layers 9a and 9b of the build-up multilayer interconnection layers B1 and B2 as well as on the conductor layers 3 and 4 of the substrate 2. Even though the through holes 6 are formed in the substrate 2, such formation does not affect the wiring, and the space on the substrate 2 can be used effectively. This means that the enlargement of the board 1 for mounting electronic circuit parts can be avoided.

According to the wiring board 1 of this embodiment, the build-up multilayer interconnection layers B1 and B2 having substantially the same thicknesses are respectively provided on the top surface S1 and the back surface S2. Thus, stresses to be applied on both sides of the substrate 2 become substantially equal to each other to cancel each other. The wiring board 1 is therefore not easily deformed.

Since the build-up multilayer interconnection layers B1 and B2 are respectively provided on both sides of the substrate 2 in this embodiment, the wiring board 1 can be made more compact with higher density as compared with the case where the build-up multilayer interconnection layers are formed only on, for example, the top surface S1.

This embodiment may be modified as follows.

FIG. 2 illustrates an electronic-circuit-parts mounted device M2 which has the bare chip C1 mounted on another wiring board 18. This wiring board 18 is provided with a three-layered build-up multilayer interconnection layer B3 only on the top surface S1. The pads 13 forming the second pad group are connected to the conductor layer 4 formed on the back surface S2. The conductor layer 4 on the back surface S2 is entirely covered with the solder resist 19. This structure also has the same function and advantages as the above-described embodiment.

The number of stacked layers in each of the build-up multilayer interconnection layers B1-B3, i.e., the number of the interlayer dielectric films 8a and 8b is not limited to two or three, but may be set to other numbers as well. Further, the number of stacked layers on the top surface S1 should not be necessarily equal to the number of stacked layers on the back surface S2.

A multilayer substrate including four to eight layers may be used as the substrate. From the viewpoint of reducing the cost, it is advantageous to select a single-layer substrate 2, whereas to achieve a higher density and a smaller size, a multilayer substrate is advantageous.

Instead of the bumps 14 in the embodiments, pins may be provided on the pads 13 that constitute the second connection terminal group. It is also possible to eliminate the provision of either the bumps 14 or the pins. Unlike in the above-described embodiments, there may be a plurality of parts mounting areas.

The pads 13 constituting the second pad group may be provided entirely on the build-up multilayer interconnection layer B2 on the back surface S2. This structure allows more pads 13 to be provided.

The conductor layers 9a and 9b constituting the build-up multilayer interconnection layers B1-B3 may be formed by metal plating (e.g., electroless nickel plating or electroless gold plating) other than electroless copper plating. In place of metal layers formed by a chemical film-forming method like plating, metal layers that are formed by a physical thin film forming method like sputtering may be selected.

Electronic circuit parts to be mounted on the wiring board 1 may be a semiconductor package, such as a BGA (Bump Grid Array), QFN (Quatro Flat Non-Leaded Array) or PGA (Pin Grid Array) having short pins, as alternatives to the bare chip 2 in the above-described embodiment.

The internal pads 12A may not be connected to directly to the top surfaces of the via holes 11, but may be connected to the via holes 11 by way of the outer conductor layer 9b, which does not extend to the outer peripheral portion of the board.

The combination of the resin obtained by sensitizing a heat-curing resin, the thermoplastic resin and the heat-resistant resin (a1+a2+b) includes, in addition to the one described in the embodiment, those as listed below:

a1+a2+b= epoxy acrylate+PES+amino resin,
epoxy acrylate+PSF+EP,
epoxy acrylate+phenoxy resin+EP,
epoxy acrylate+PE+EP,
epoxy acrylate+PSF+amino resin,
epoxy acrylate+phenoxy resin+amino resin,
epoxy acrylate+PE+amino resin,
epoxy acrylate+PES+amino resin and EP,
epoxy acrylate+PSF+amino resin and EP,
epoxy acrylate+phenoxy resin+amino resin and EP,
epoxy acrylate+PE+amino resin and EP,
photosensitive PI+PES+EP,
photosensitive PI+PES+amino resin,
photosensitive PI+PSF+EP,
photosensitive PI+phenoxy resin+EP,
photosensitive PI+PE+EP,
photosensitive PI+PSF+amino resin,
photosensitive PI+phenoxy resin+amino resin,
photosensitive PI+PE+amino resin,
photosensitive PI+PES+amino resin and EP,
photosensitive PI+PSF+amino resin and EP,
photosensitive PI+phenoxy resin+amino resin and EP,
photosensitive PI+PE+amino resin and EP,
epoxy acrylate and photosensitive PI+PES+amino resin,
epoxy acrylate and photosensitive PI+PSF+EP,
epoxy acrylate and photosensitive PI+phenoxy resin+EP,
epoxy acrylate and photosensitive PI+PE+EP,
epoxy acrylate and photosensitive PI+PSF+amino resin,
epoxy acrylate and photosensitive PI+phenoxy resin+amino resin,
epoxy acrylate and photosensitive PI+PE+amino resin,
epoxy acrylate and photosensitive PI+PES+amino resin and EP,
epoxy acrylate and photosensitive PI+PSF+amino resin and EP,
epoxy acrylate and photosensitive PI+phenoxy resin+amino resin and EP, and
epoxy acrylate and photosensitive PI+PE+amino resin and EP.

Other combinations than those listed here are of course acceptable.

Next, a second embodiment of this invention will be described in detail referring to FIGS. 3 to 7.

Figure 3:
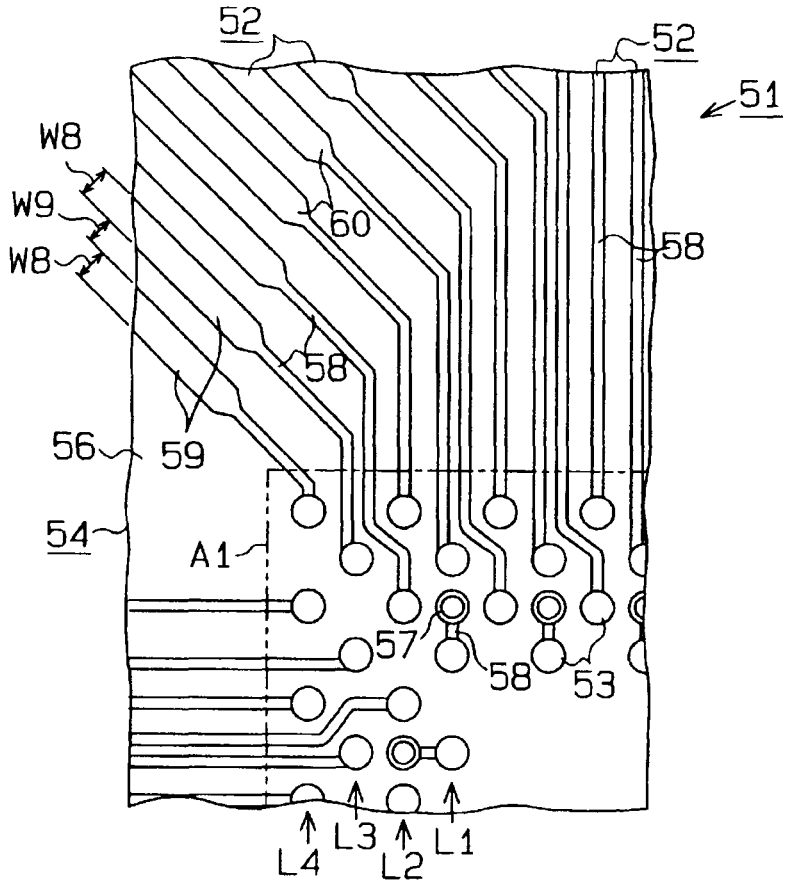
FIG. 3 is a partial plan view of a wiring board according to the second embodiment of this invention.

FIG. 3 shows approximately a quarter of a wiring board 51 for mounting electronic circuit parts. The wiring board 51 has a glass epoxy substrate 54 as a core material. It is also possible to employ substrates other than the glass epoxy substrate 54, such as a polyimide substrate and a BT (bismaleimidotriazine) resin substrate. An adhesive layer (dielectric film) 55 is formed on each surface of the substrate 54 using an adhesive specific to the additive method. The surface of each adhesive layer 55 is roughened so as to have a multiplicity of anchoring pits. As the adhesive employable here, a mixture of a photosensitive resin, which can be made hardly soluble in acids or oxidizing agents by a curing treatment, and a cured granular heat-resistant resin soluble in acids or oxidizing agents is employed. The adhesive having such composition is suitable for forming fine images with high accuracy. Details of the composition of the adhesive are the same as in the foregoing embodiment.

Each adhesive layer 55 has a permanent resist 56 which is of a photosensitive resin formed on the roughened surface thereof. The portions having no permanent resist 56 have a conductor layer such as pads 53 formed by electroless copper plating. Another conductor layer (not shown) is formed on the rear side of the wiring board 51, i.e., the surface opposed to the mother board.

A parts mounting area A1 is defined approximately in the center of the top surface of the wiring board 51 where a chip is to be mounted. A plurality of signal lines 52 and a plurality of circular pads 53 are formed on the top surface of the wiring board 51 at the peripheral portion of the parts mounting area A1. Those pads 53 are grouped into four rows of pads L1 to L4 at the peripheral portion of the parts mounting area A1, which are arranged in a zigzag fashion. One signal line 52 is connected to each pad 53. Most of the signal lines 52 extend radially toward the board's outer peripheral portion. One of the ends of such signal lines 52 are respectively connected to a plurality of pads (not shown), which are discretely arranged on the back surface of the board 51 by way of through holes (not shown) formed discretely at the board's outer peripheral portion. Some of the signal lines 52 are very short and are connected to adjoining interstitial via holes 57.

According to this embodiment, each signal line 52 has a first wiring pattern 58 having a predetermined width, a second wiring pattern 59 wider than the first wiring pattern 58, and a nearly-trapezoidal taper-shaped pattern 60 which connects both wiring patterns 58 and 59. The first wiring pattern 58 is located in substantially the center portion of the board, which has a relatively high wiring density and is connected to the associated pad 53. The second wiring pattern 59 is located in the outer peripheral portion of the board which has a relatively low wiring density. Therefore, the width of each signal line 52 varies in accordance with a change in wiring density. The first wiring pattern 58 and the second wiring pattern 59 are connected together along a common center line CL by the taper-shaped pattern 60. Both side edges T1 of the taper-shaped pattern 60 are inclined to the center line CL and both side edges of each wiring pattern 59 by a predetermined angle θ (see FIG. 5). The width of the taper-shaped pattern 60 is so set as to increase toward the width of the second wiring pattern 59 from the width of the first wiring pattern 58.

Figure 5A:
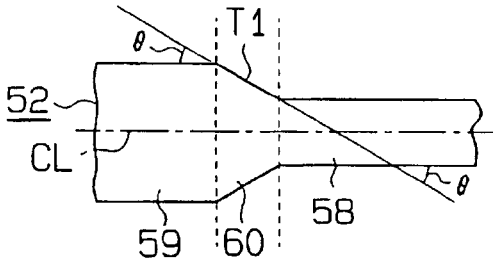
FIGS. 5A through 5C are partial plan views illustrating some variations of the signal lines in FIG. 3.
Figure 5B:
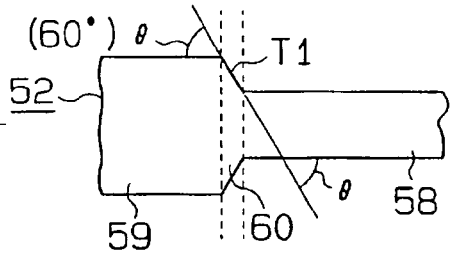
Figure 5C:
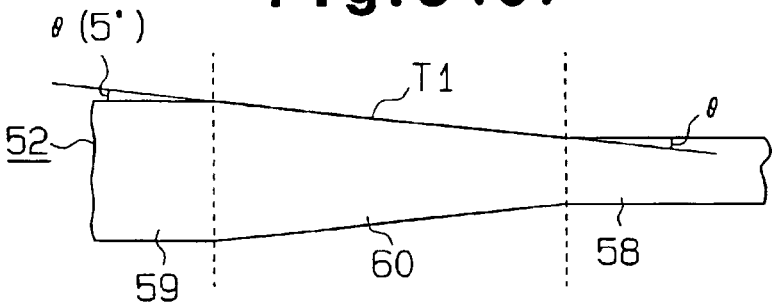

As shown in FIG. 5A, the angle θ should range from 10° to 45°, preferably from 15° to 40°, particularly from 20° to 35°. The angle θ, if set to 10° to 45°, is convenient in the case where automatic wiring is done by a CAD (Computer Aided Design) system. If the angle θ is less than 10° as exemplified in FIG. 5C, the taper-shaped pattern 60 becomes long, which may lead to some difficulty in accomplishing the wiring. If the angle θ exceeds 45°, as exemplified in FIG. 5B, however, it may not be possible to prevent the occurrence of cracks in the permanent resist 56.

Figure 4:
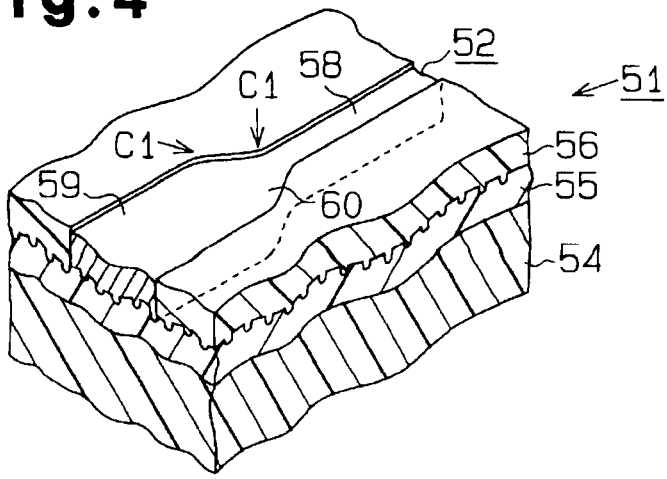
FIG. 4 is a cross-sectional perspective view showing parts of signal lines used on the wiring board in FIG. 3.

As shown in FIG. 4, portions C1 and C2 of the taper-shaped pattern 60, which are side edges to be coupled to the first and second wiring patterns 58 and 59, are rounded to remove the sharp corners.

Figure 6:
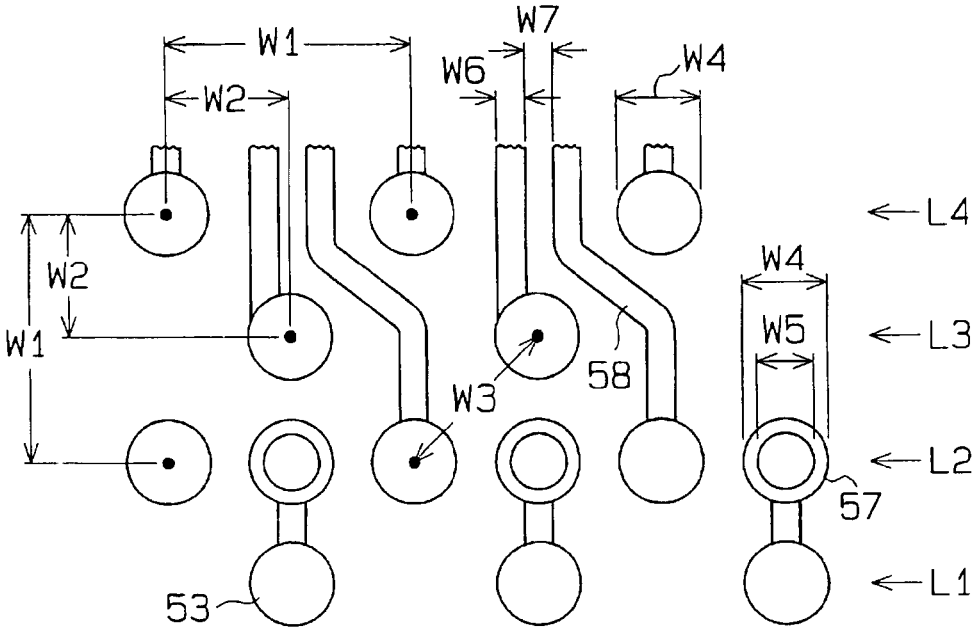
FIG. 6 is a partly enlarged plan view showing an array of pads used for the wiring board in FIG. 3.

The sizes W1 to W9 of the individual parts on the wiring board 51 in this embodiment are set in the following ranges. The pitch between the pads 53 indicated by W1 in FIG. 6 is in the range of 11 mils to 17 mils, and the pitch between the pads 53 indicated by W2 is in the range of 5.5 mils to 8.5 mils. The pitch between the pads 53 indicated by W3 ranges from 8 mils to 12 mils. The maximum inside diameter of the interstitial via holes 57 indicated by W4 is in the range of 4 mils to 6 mils. The diameter of the pads 53 is equal to this inside diameter. The minimum inside diameter of the interstitial via holes 57 indicated by W5 ranges from 3 mils to 4 mils. The width of the first wiring pattern 58 indicated by W6 ranges from 1.3 mils to 2 mils. The space between the first wiring patterns 58 indicated by W7 ranges from 1.3 mils to 2 mils. The width of the second wiring pattern 59 indicated by W8 in FIG. 3 ranges from 2.8 mils to 5.8 mils, and the space between the second wiring patterns 59 indicated by W9 ranges from 1.8 mils to 3.8 mils. It is to be noted that 1 mil is one thousandth of an inch, which is equivalent to approximately 25.4 μ.

According to this embodiment, the narrower first wiring pattern 58 formed in the center portion of the board is connected to the wider second wiring pattern 59 formed at the outer peripheral portion of the board by the taper-shaped pattern 60. The width W6 of the signal line 52 is set narrower in nearly the center portion of the board, which has a relatively high wiring density. It is thus possible to sufficiently secure the space W7 between the first wiring patterns 58 to relatively easily provide a suitable insulation interval. This can overcome the difficulty of providing wiring on an area with a relatively high wiring density. More specifically, even if the pads 53 are formed close to each other, a plurality of signal lines 52 can be laid out between the pads 53.

Figure 9:
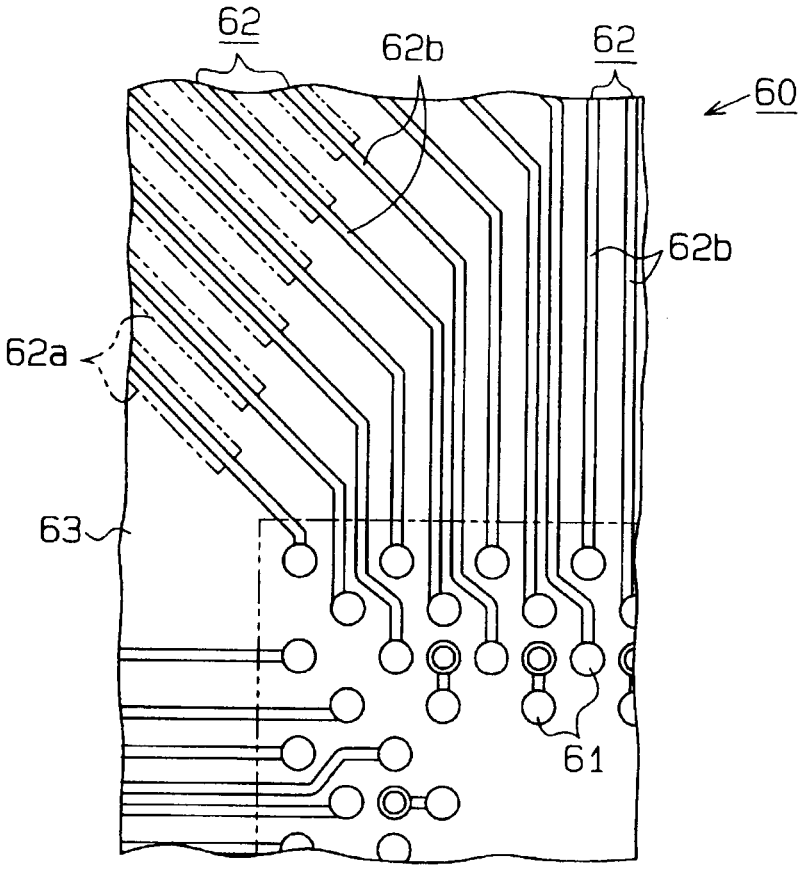
Fig.9(Prior Art)
FIG. 9 is a partial plan view showing a conventional wiring board corresponding to the wiring board in FIG. 3.
Figure 10:
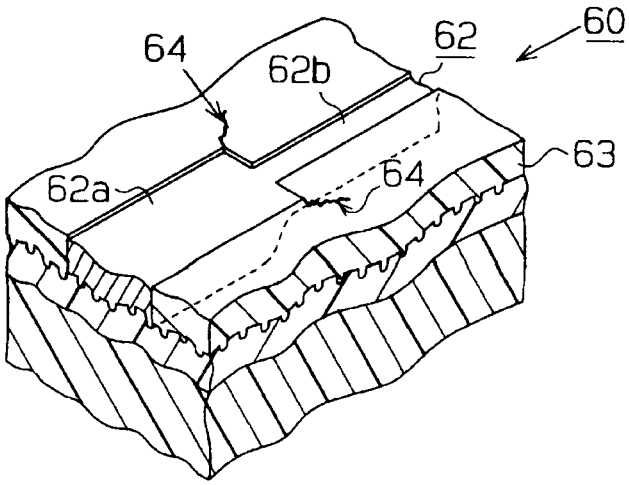
Fig.10(Prior Art)
FIG. 10 is a cross-sectional perspective view depicting parts of signal lines used on the wiring board in FIG. 9.

In this embodiment, the width W8 of the signal line 52 is made wider at the board's outer peripheral portion, which has a low wiring density as shown in FIG. 3. The wiring resistance therefore becomes smaller than that of the conventional structure (see FIG. 9), which simply uses the signal lines 62 having narrow and uniform widths, so that a circuit malfunction is unlikely to occur. In this embodiment, the first wiring pattern 58 and the second wiring pattern 59, which have different widths, are connected together by the taper-shaped pattern 60, the width of which continuously changes. Stress is therefore unlikely to concentrate on a specific portion of the permanent resist 56 as compared with the prior art (see FIG. 9), which directly connects the second wiring pattern 62a to the first wiring pattern 62b. It is thus possible to prevent the occurrence of cracks 64 in the permanent resist 63, which occur in the prior art indicated in FIG. 10. The wiring board 51 for mounting electronic circuit parts according to this embodiment therefore has excellent reliability.

The second embodiment may be modified as follows.

Figure 7:
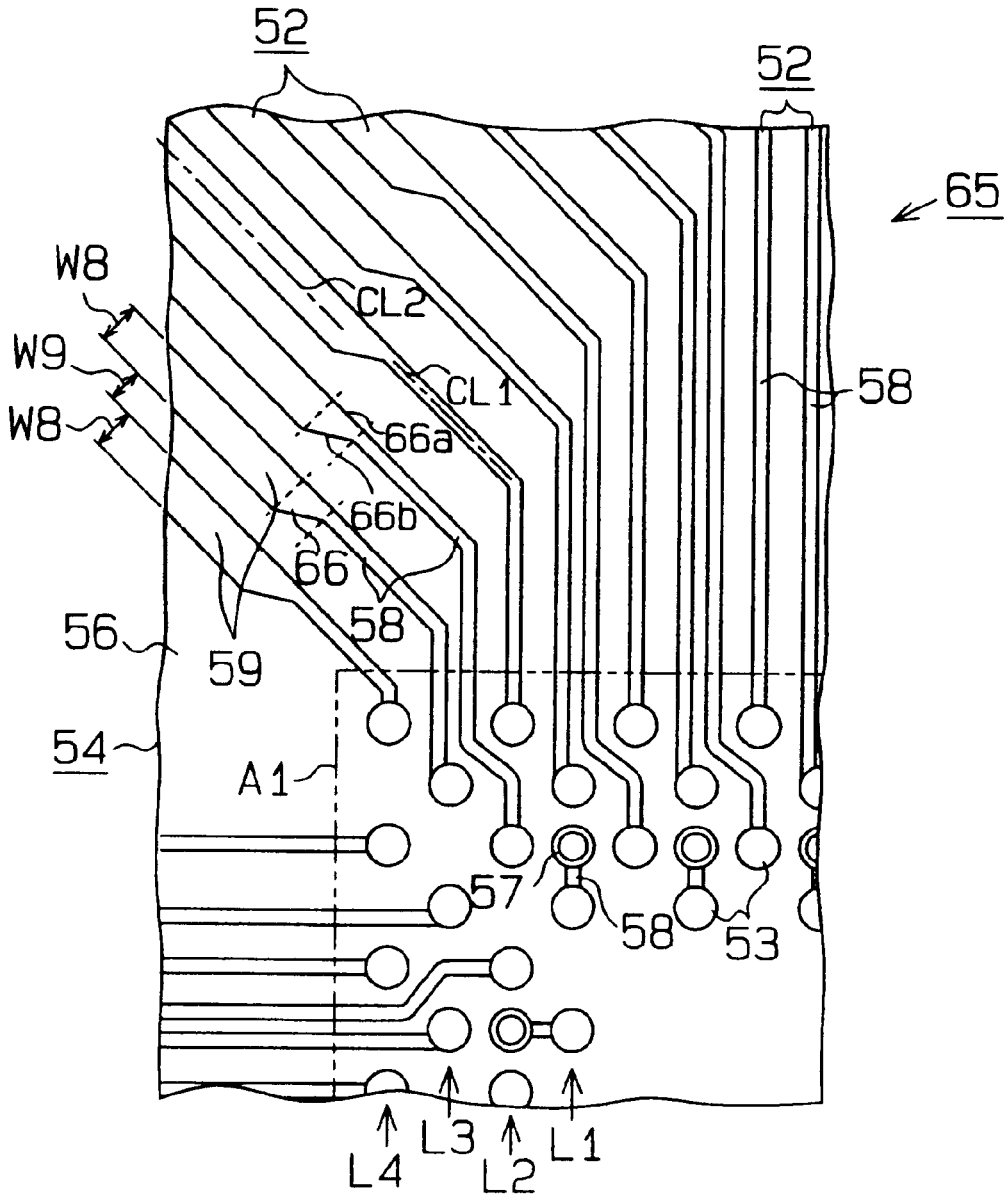
FIG. 7 is a partial plan view of a wiring board according to a modification of the second embodiment.

On the wiring board 65 shown in FIG. 7, the first and second wiring patterns 58 and 59 are connected together by the taper-shaped pattern 66. The connected portion 66 in this example has a first side edge 66a extending in parallel to the center lines CL1 and CL2 of both wiring patterns 58 and 59, and a second side edge 66b inclined to both center lines CL1 and CL2. This structure also has the same function and advantages of the second embodiment. In this case, the number of intersections where stress is likely to concentrate is reduced, so that cracks are less likely to occur in this structure than in the second embodiment shown in FIG. 3.

The types of the wiring patterns 58 and 59 constituting each signal line 52 are not limited to two as shown in the second embodiment, but the wiring width may be increased in three or more stages in accordance with the wiring density on the board's surface.

Industrial Applicability

As specifically discussed above, this invention can achieve the higher density and compact size of a wiring board, which facilitates to designing interconnection.

What is claimed is:

1. A board for mounting electronic circuit parts, comprising:

a first connection terminal group including a plurality of connection terminals formed over a top surface of a substrate having through holes formed therein;

a second connection terminal group including a plurality of connection terminals formed [at] *over* a peripheral portion of a back surface of said substrate, said first connection terminal group being connected to said second connection terminal group by way of said through holes; and a build-up multilayer interconnection layer formed on said top surface of said substrate and including at least one conductor layer and at least one insulator layer alternately stacked one on another, said at least one insulator layer having a plurality of via holes for electric connection of said at least one conductor layer electrically connected to said through holes, said first connection terminal group being densely formed on an outermost layer of said build-up multilayer interconnection layer, and said second connection terminal group being discretely formed at the peripheral portion of the back surface of said substrate.

2. The board according to claim 1, wherein said first connection terminal group is formed on said outermost layer of said build-up multilayer interconnection layer and those connection terminals in said first connection terminal group are electrically connected to said at least one conductor layer of said build-up multilayer interconnection layer by way of said via holes respectively.

3. The board according to claim 1, wherein said build-up multilayer interconnection layer is formed on said top surface and back surface of said substrate, each build-up multilayer interconnection layer including at least one conductor layer and at least one insulator layer alternately stacked one on another;

said at least one insulator layer having a plurality of via holes for electric connection of said at least one conductor layer electrically connected to said through holes;

wherein said first connection terminal group and said second connection terminal group are respectively formed on outermost layers of said build-up multilayer interconnection layers; and wherein those connection terminals located in a center portion of said first connection terminal group and said connection terminals of said second connection terminal group are electrically connected to said conductor layers of said build-up multilayer interconnection layers via associated via holes.

4. The board according to claim 1, wherein said build-up multilayer interconnection layer includes at least one conductor layer and at least one insulator layer alternately stacked one on another;

wherein said at least one insulator layer has a plurality of via holes for connecting electrically the respective conductor layers; and wherein said at least one conductor layer is laid out in forward and radial directions toward an outer peripheral portion of said board while being connected via associated via holes.

5. The board according to claim 1, wherein said insulator layer is formed using a photosensitive resin.

6. The board according to claim 1, wherein said at least one insulator layer contains an epoxy acrylate, a polyether sulfone, epoxy resin particles, and a photosensitive monomer.

7. The board according to claim 1, wherein said at least one insulator layer contains an epoxy acrylate, a polyether sulfone, melamine resin particles, and a photosensitive monomer.

8. The board according to claim 1, wherein said insulator layer is formed using a mixture of a resin obtained by photosensitizing a heat-curing resin, which is hardly soluble in acids or oxidizing agents, and heat-resistant resin particles soluble in acids or oxidizing agents.

9. The board according to claim 8, wherein said heat-resistant resin particles are at least one selected from the group including amino resin particles and epoxy resin particles.

10. The board according to claim 8, wherein said acids or oxidizing agents include chromic acid, chromates, permanganates, hydrochloric acid, phosphoric acid, formic acid, sulfuric acid and hydrofluoric acid.

11. A board for mounting electronic circuit parts, comprising:

a first connection terminal group including a plurality of first connection terminals densely formed over a top surface of a substrate having through holes formed therein;

a second connection terminal group including a plurality of second connection terminals formed at at least a peripheral portion of a back surface of said substrate, said first connection terminal group being connected to said second connection terminal group by way of said through holes; and a build-up multilayer interconnection layer formed on said top surface of said substrate and including at least one conductor layer and at least one insulator layer alternately stacked one on another, said at least one insulator layer having a plurality of via holes for electrical connection of said at least one conductor layer electrically connected to said through holes, said first connection terminal group being formed on an outermost layer of said build-up multilayer interconnection layer, and wherein said at least one insulator layer comprises a composite resin of a resin hardly soluble in acids or oxidizing agents, which is obtained by photosensitizing a heat-curing resin, and a thermoplastic resin, and heat-resistant resin particles soluble in acids or oxidizing agents.

12. The board according to claim 11, wherein said resin obtained by photosensitizing a heat-curing resin is at least one resin selected from the group including epoxy acrylates and photosensitive polyimides, and said thermoplastic resin is at least one resin selected from the group including polyether sulfones, polysulfones, phenoxy resins and polyethylenes.

13. A board for mounting electronic circuit parts, comprising a plurality of connection terminals and a plurality of signal lines formed on an insulator layer, said plurality of connection terminals being formed densely and being respectively connected to said signal lines, each of said signal lines comprising:

a plurality of wiring patterns with different widths; and a taper-shaped pattern connecting said wiring patterns with said different widths so as to have a width continuously changing, each of said signal lines having a smaller width at an area having a relatively high wiring density than at an area having a relatively low wiring density, wherein side edges of said taper-shaped pattern are connected to associated side edges of said wiring patterns, and connected portions therebetween are rounded.

14. The board according to claim 13, wherein said width of said signal lines is set so as to become wider toward an outer peripheral portion of said board.

15. The board according to claim 13, wherein said insulator layer has a rough surface.

16. The board according to claim 13, wherein said insulator layer comprises heat-resistant resin particles hardly soluble in acids or oxidizing agents and cured heat resistant resin particles soluble in acids or oxidizing agents.

17. The board according to claim 13, wherein said wiring patterns with different widths include a first wiring pattern and a second wiring pattern wider than said first wiring pattern, wherein said taper-shaped pattern for connecting said first wiring pattern to said second wiring pattern has side edges inclined to a common center line of said first wiring pattern and said second wiring pattern by an angle of 10 to 45.

18. A board for mounting electronic circuit parts, comprising:

a first connection terminal group including a plurality of connection terminals formed over a top surface of a substrate having through holes formed therein;

a second connection terminal group including a plurality of connection terminals formed at a peripheral portion of a back surface of said substrate, said first connection terminal group being connected to said second connection terminal group by way of said through holes; and a build-up multilayer interconnection layer formed on said top surface of said substrate and including at least one conductor layer and at least one insulator layer alternately stacked one on another, said at least one insulator layer having a plurality of via holes for electric connection of said at least one conductor layer electrically connected to said through holes, wherein said at least one conductor layer is laid out in forward and radial directions toward the outer peripheral portion while being connected via associated via holes, said first connection terminal group being densely formed on an outermost layer of said build-up multilayer interconnection layer, and said second connection terminal group being discretely formed at the peripheral portion of the back surface of said substrate, said connection terminal in said first connection terminal group are electrically connected to said at least one conductor layer of said build-up multilayer interconnection layer by way of said via holes.

*19. A board for mounting electronic circuit parts, comprising:*

*a first connection terminal group including a plurality of connection terminals formed over a top surface of a substrate having through holes formed therein;*

*a second connection terminal group including a plurality of connection terminals formed over a peripheral portion of a back surface of said substrate, said first connection terminal group being connected to said second connection terminal group by way of said through holes; and*

*a build-up multilayer interconnection layer formed on said top surface of said substrate and including at least one conductor layer and at least one insulator layer alternately stacked one on another, the at least one conductor layer comprising an outer conductor pattern formed by a plurality of wiring lines,*

*said at least one insulator layer having a plurality of via holes for electric connection of said at least one conductor layer electrically connected to said through holes,*

*said first connection terminal group being densely formed on an outermost layer of said build-up multilayer interconnection layer,*

*said second connection terminal group being formed over the peripheral portion of the back surface of said substrate,*

*said first connection terminal group comprising internal pads and external pads positioned outside the internal pads, the internal pads including the via holes electrically connected to the through holes,*

*wherein the external pads are provided in a plurality of rows and include first external pads provided on an outermost row and second external pads provided in a row inside the outermost row, and*

*said first external pads and second external pads are each connected to the wiring lines extending towards the outer peripheral portion of the board.*

*20. The board according to claim 19, wherein said build-up multilayer interconnection layer is formed on said top surface and back surface of said substrate, each build-up multilayer interconnection layer including at least one conductor layer and at least one insulator layer alternately stacked one on another;*

*said at least one insulator layer having a plurality of via holes for electric connection of said at least one conductor layer electrically connected to said through holes;*

*wherein said first connection terminal group and said second connection terminal group are respectively formed on outermost layers of said build-up multilayer interconnection layers; and*

*wherein those connection terminals located in a center portion of said first connection terminal group and said connection terminals of said second connection terminal group are electrically connected to said conductor layers of said build-up multilayer interconnection layers via associated via holes.*

*21. The board according to claim 19, wherein first to fifth rows of the first connection terminal group starting from the outermost row is used as external pads.*

*22. The board according to claim 19, wherein a solder resist is provided to protect the wiring lines.*

*23. The board according to claim 19, wherein said internal pads are electrically connected to an inner conductor layer extending towards the outer peripheral portion of the board.*

*24. The board according to claim 19, wherein said substrate is made of a glass-epoxy resin or a bismaleimidotriazine resin.*

*25. The board according to claim 19, wherein said insulating layer is made of resin.*

*26. The board according to claim 19, wherein said insulating layer has a roughened surface.*

*27. A board for mounting electronic circuit parts, comprising:*

*a substrate having through holes formed therein and a first surface and a second surface, the second surface being positioned opposite to the first surface;*

*a first connection terminal group including a plurality of connection terminals formed at a predetermined area over the first surface of the substrate;*

*a second connection terminal group including a plurality of connection terminals formed over a peripheral portion of the second surface of the substrate; and*

*a build-up multilayer interconnection layer including conductor layers and insulator layers alternately stacked one on another on the first surface of the substrate, said conductor layers being electrically connected to each other by way of via holes and said conductor layers being electrically connected to said through holes;*

*wherein said first connection terminal group is formed on an outermost layer of said build-up multilayer interconnection layer, at least one connection terminal located at a central portion of the first connection terminal group is electrically connected to the conductor layers of the build-up multilayer interconnection layer by way of said via holes within said predetermined area, said first connection terminal group includes external pads located over an outer peripheral portion of the substrate, and said external pads are connected to the associated via holes by way of the conductor layer extending toward the outer peripheral portion of the board.*

*28. The board according to claim 27, wherein said substrate is a multilayer substrate.*

*29. The board according to claim 27, wherein said external pads include a plurality rows of pads.*

*30. The board according to claim 27, wherein one of the electronic circuit parts has a plurality of electrodes, wherein said first connection terminal group includes internal terminals located in the central portion of the first connection terminal group, wherein said internal terminals are constituted of the via holes located directly below the corresponding electrodes.*

*31. The board according to claim 27, wherein one of the electronic circuit parts has a plurality of electrodes, wherein said first connection terminal group includes internal terminals located in the central portion of the first connection terminal group, wherein said internal terminals include a combination of pads and the via holes.*

*32. The board according to claim 31, wherein said internal terminals include the pads and the via holes that are located directly below the electrodes of one of the electronic circuit parts.*

*33. The board according to claim 32, wherein said pads are connected to said via holes by way of the conductor layers.*

*34. The board according to claim 27, wherein each of said via holes has a diameter of about 80 μm or less.*

*35. The board according to claim 27, wherein the second connection terminal group has a surface exposed outwardly.*

*36. The board according to claim 35, wherein the exposed surface of the connection terminal group is covered with a gold layer.*

*37. The board according to claim 27, wherein the first connection terminal group includes internal terminals located in the central portion of the first connection terminal group, and the internal terminals include pads and via holes connected to the pads through conductor patterns formed over the first surface of the substrate, respectively.*

* * * * *